United States Patent [19]
Gigante

[11] 4,372,803
[45] Feb. 8, 1983

[54] METHOD FOR ETCH THINNING SILICON DEVICES

[75] Inventor: Joseph R. Gigante, Oceanside, Calif.

[73] Assignee: The United States of America as represented by the Secretary of the Navy, Washington, D.C.

[21] Appl. No.: 191,658

[22] Filed: Sep. 26, 1980

[51] Int. Cl.³ .......................................... H01L 21/308
[52] U.S. Cl. ..................................... 156/626; 156/628; 156/637; 156/651; 156/657; 156/662; 252/79.3
[58] Field of Search ............... 156/626, 628, 637, 645, 156/651, 652, 653, 657, 659.1, 662; 252/79.3, 79.4, 79.5; 29/580; 134/3

[56] References Cited

U.S. PATENT DOCUMENTS

| 3,088,888 | 5/1963 | Leff | 156/651 |
|---|---|---|---|
| 3,721,588 | 3/1973 | Hays | 148/175 |
| 3,721,593 | 8/1971 | Hays et al. | 156/628 |
| 3,767,494 | 10/1973 | Muraoka et al. | 156/662 |
| 3,846,198 | 11/1974 | Cheng et al. | 156/17 |
| 3,863,333 | 2/1975 | Loya | 156/637 |
| 3,892,606 | 7/1975 | Chappelow et al. | 148/174 |
| 3,929,528 | 12/1975 | Davidson et al. | 148/175 |
| 3,959,045 | 5/1976 | Antypas | 156/3 |
| 3,980,507 | 9/1976 | Carley | 148/187 |
| 3,997,381 | 12/1976 | Wanless | 252/79.3 |
| 4,004,046 | 1/1977 | Price | 156/626 |
| 4,017,341 | 4/1977 | Suzuki et al. | 148/174 |
| 4,026,740 | 5/1977 | Owen | 156/628 |
| 4,050,979 | 9/1977 | Smeltzer et al. | 156/647 |
| 4,142,926 | 3/1979 | Morgan | 148/187 |

FOREIGN PATENT DOCUMENTS 1195944 6/1970 United Kingdom ............ 156/659.1

Primary Examiner—Edward C. Kimlin
Assistant Examiner—F. K. Wine
Attorney, Agent, or Firm—R. S. Sciascia; Charles D. B. Curry; George L. Craig

[57] ABSTRACT

An improved method for etch-thinning silicon devices using three sequential etches. The device is pre-thinned in a hot KOH-H₂O etch. The thinning etch is a hydrofluoric, nitric, acetic acids (1:3:10) and a precise amount of hydrogen peroxide mixture. The cleanup etch is a potassium permanganate, hydrofluoric and acetic acids mixture. The result is a repeatedly specular, smooth, uniform, 10 micron thick membrane over the pixels with a p+ surface to enhance the CCI optical response.

5 Claims, 6 Drawing Figures

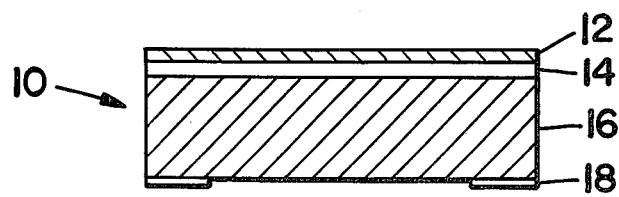
FIG_1
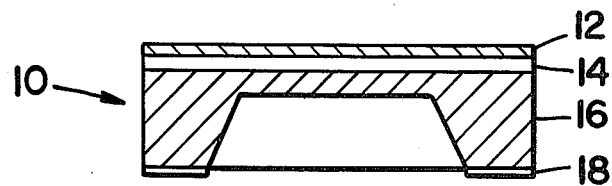
FIG_2
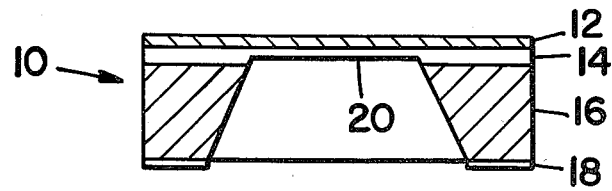
FIG_3
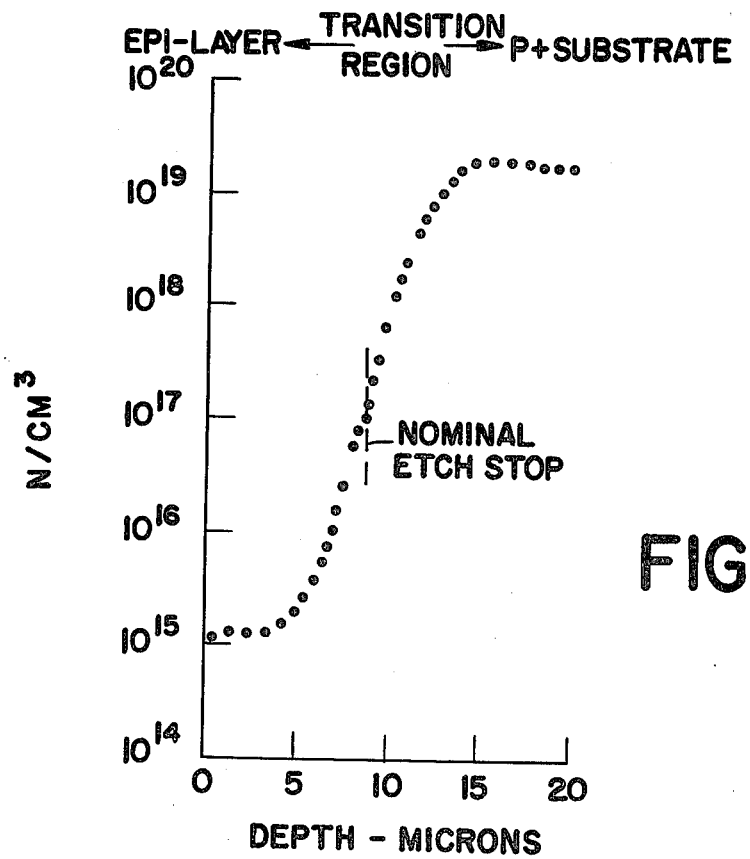
FIG_4

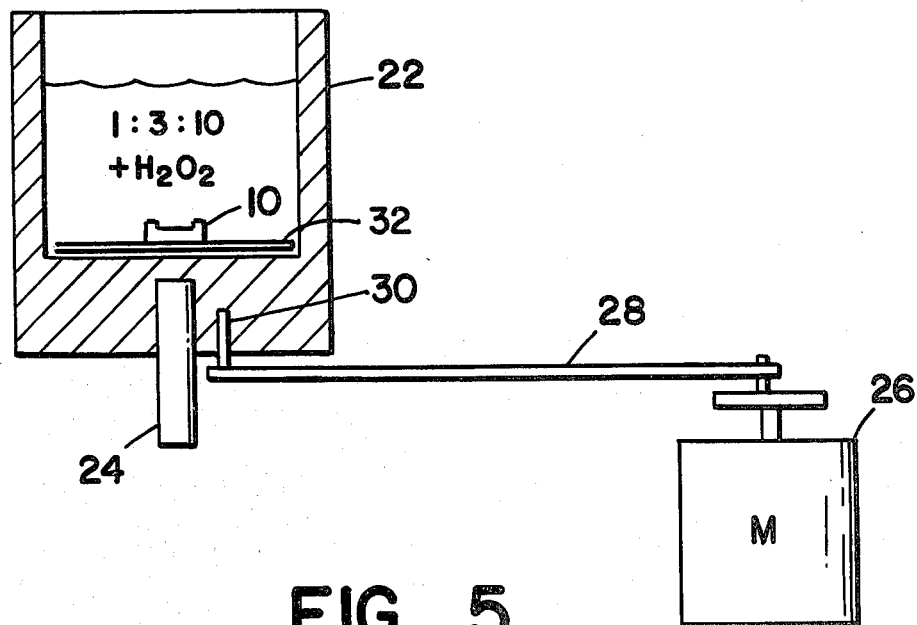
FIG_5
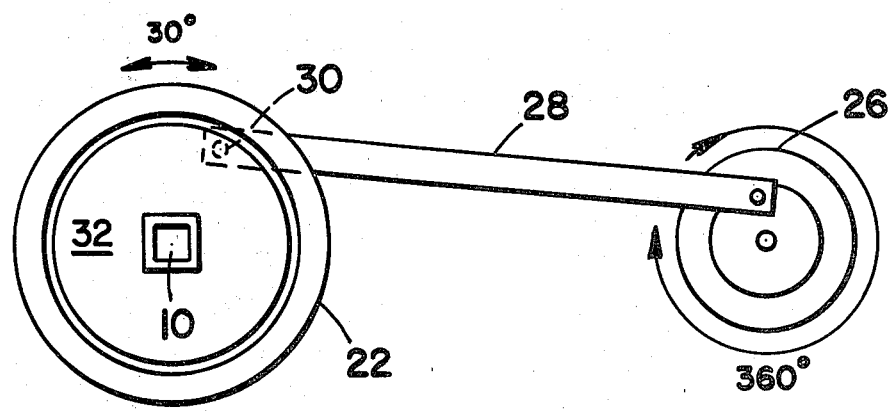
FIG_6

METHOD FOR ETCH THINNING SILICON DEVICES

BACKGROUND OF THE INVENTION

1. Field of the Invention

The present invention relates to the fabrication of charge coupled imagers, and more particularly to an improved method for etch thinning silicon devices.

2. Description of the Prior Art

It has been proposed to make charged coupled imagers (CCI) with the pixel area thinned to nominally 10 microns. This is done so that photons may enter the device through the rear unencumbered, rather than through the pixel interconnects on the front side. The processing involves fabricating the CCI in a p-type epi-layer which is on a p+ substrate (<100> orientation, 10 to 20 mils thick). After CCI fabrication is completed device thinning is employed. One thinning technique is to use a buried p++ layer as a virtual etch stop for KOH, the etchant. This technique, however, is not yet a practical art. Another technique uses a 1:3:10 etch (HF:HNO₃:Acetic), but drips $H_2O_2$ into the etchant. This tends to passivate the silicon and stop the etching too soon.

SUMMARY OF THE INVENTION

Accordingly the present invention provides an improved method for etch thinning silicon devices using three sequential etches. The device is pre-thinned in a hot KOH-$H_2O$ etch. The thinning etch is a hydrofluoric, nitric, acetic acids (1:3:10), and a precise amount of hydrogen peroxide mixture. The clean up etch is a potassium permanganate, hydrofluoric and acetic acids mixture. The result is a repeatedly specular, smooth, uniform, 10 micron thick membrane over the pixels with a p+ surface to enhance the CCI optical response.

Therefore, it is an object of the present invention to provide an improved method for etch thinning silicon devices which repeatedly produces a specular, smooth, uniform, 10 micron thick membrane over the pixels of a CCI device.

Other objects, advantages and novel features will be apparent from the following detailed description when read in conjunction with the appended claims and attached drawing.

BRIEF DESCRIPTION OF THE DRAWING

FIG. 1 is a cross-section of the CCI chip starting material.

FIG. 2 is a cross-section of the CCI chip after the first etch.

FIG. 3 is a cross-section of the CCI chip after the second etch.

FIG. 4 is a graph of the doping profile for the CCI.

FIGS. 5 and 6 are schematic view of the wash tub agitation used during the second etch.

DESCRIPTION OF THE PREFERRED EMBODIMENT

A thinned charge coupled imager's (CCI) optical response is dependent on the thickness and uniformity of the membrane over the pixel area. This is accomplished in this invention by using an etch sequence which virtually stops etching at the interface of a high resistivity epitaxial layer on a low resistivity substrate. Referring now to FIGS. 1–3 the CCI 10 has an epitaxial layer 12, a transition region 14 and a p+ substrate 16. An etch mask 18 is placed on the p+ substrate 16 to define the area to be thinned. The epitaxial layer 12 provides two advantages: (1) it can be grown with a very uniform thickness, and (2) it provides a uniformly doped layer which acts as an etch stop for the process described herein. The p+ substrate 16 is typically boron doped to 0.010 ohm-cm (or $2 \times 10^{19}/cm^3$) and may be 10 to 20 mils thick. The epi-layer 12 is nominally boron doped to 30 ohm-cm (or $5 \times 10^{14}/cm^3$) and is 5 to 15 microns thick. There is a natural doping gradient between the substrate 16 and the epi-layer 12 which forms the transition region 14 of 5 to 10 microns thick. It is within this transition region 14 that the etching process terminates.

To reproducably etch thin, the low resistivity, <100> oriented substrate 16 is pre-thinned to nominally one to two mils of the epi-layer 12. This can be accomplished by using a 2KOH:3$H_2O$ solution at 60° C. with ultrasonic agitation to etch through the substrate 16 until the thinned section just starts to become translucent when viewed with a bright light behind it. This occurs when the thinned material is nominally 1.35 mils thick. The KOH etched surface has an orange peel roughness. The etching time is typically 20 to 30 hours.

KOH etching is normally done on a whole wafer containing many CCIs 10. The sections of the wafer substrate 16 to be KOH etched are defined by patterned holes in either an oxide layer or a chrome-gold metallized layer in the backside which forms the etch mask 18. The epi-layer 12 side is protected by a sapphire substrate (not shown) held on by polypropylene. The wafer made up of many CCIs 10 is then sawed up into individual units or chips. This may also be accomplished by etching scribe lines with the KOH etch and breaking the units apart.

The CCI chips 10 are next etched with the thinning etchant. The CCI chips 10 may be etched either individually or multiply. The epi-layer 12 side is protected by a sapphire substrate 32 held on by parraffin (not shown).

The thinning etchant is 1 HF (49%):3HNO₃ (70%):10 Acetic (Glacial) plus a critical amount of $H_2O_2$ (30%). The amount of $H_2O_2$ is critical depending on the area to be etched. If too little is used the etch will not stop at the transition region 14; and if too much is used the surface will passivate and etch nonuniformly or not at all. 2 cc of $H_2O_2$ for 350 cc of 1:3:10 etchant is suitable to stop an area ⅛" square, whereas 5 cc of $H_2O_2$ for 350 cc of 1:3:10 etchant is needed for areas up to 3 square inches. The basic characteristic of the 1:3:10 etchant is that it stops at a surface with a doping density of nominally $10^{17}/cm^3$ (see FIG. 4), and leaves the back surface 20 slightly p+ compared to the epi-layer 12. This is desirable because it causes charge carriers generated near the back surface 20 to diffuse and drift toward the pixels and enhance the CCI's optical response.

The type of agitation used with the 1:3:10 etch also affects the uniformity. Stirred etch baths give nonuniform etches. Ultrasonic baths give fairly uniform etches, but have a problem of over etching at the edges of the etch mask 18. The most uniform etching is achieved with a washtub type agitation as shown in FIGS. 5 and 6. In this mode an etch beaker 22 is rotated about its axis 24 through about 30° by a motor 26 which is connected by a lever arm 28 to a point 30 on the beaker which is off center. The motor 26 rotates at approximately 200 rpm, causing the beaker 22 to oscillate at a rate of 200 times a minute.

The surface being 1:3:10 etched goes through many color changes during the etching. The etching is stopped when the surface 20 appears flat and reflecting to the observer, typically about one to two hours. Due to the discoloration the surface 20 will not necessarily be shiny.

The discoloration is removed by dipping the unit into an etch of 1.0 gms of potassium permanganate, 150 ml HF (49%) and 150 ml Acetic (Glacial). This etch is stirred at a fairly high rate and the unit is held parallel to the etchant for 30 second intervals until all the stain films are gone and the surface 20 is specular, typically about one to two minutes.

Examples of the method described in the instant invention are described below although the instant invention is by no means limited to the examples.

EXAMPLE I

Substrate boron concentration: $7 \times 10^{18}/cm^3$
Epi-layer boron concentration: $5 \times 10^{14}/cm^3$
Epi-layer thickness: 11.9 microns
CCI pixel area: $120 \times 120$ mils The mean thickness after KOH pre-thinning was 31.3 microns with a standard deviation of 1.8 microns. For 31 CCI chips, the means thickness after 1:3:10 etch and clean-up etch was 13.1 microns with a standard deviation of 0.8 microns.

EXAMPLE II

Substrate boron concentration: $5 \times 10^{18}/cm^3$
Epi-layer boron concentration: $4.2 \times 10^{14}/cm^3$
Epi-layer thickness: 11.3 microns
CCI pixel area: $350 \times 350$ mils The mean thickness after KOH pre-thinning was 29.2 microns with a standard deviation of 6.8 microns. For 7 CCI chips, the mean thickness after 1:3:10 etch and clean-up etch was 13.9 microns with a standard deviation of 0.4 microns. For one CCI chip, the mean thickness was 13.6 microns with a standard deviation of 0.2 microns measured at 25 positions.

What is claimed is:

1. The method of etch-thinning silicon devices in three sequential etches such that a uniform approximately 10 micron thick membrane is formed over the pixels of the device comprising the steps in combination:
    (a) providing a multi-layer wafer, said wafer having a first layer transparent to light and impervious to etching fluids, an epitaxial second layer having one surface adhesively bonded to one side of said first layer, and a p+ third layer formed on the opposite surface of said epitaxial layer, said third layer having a higher boron doping level than said second layer such that there exists a transition region between said third layer and said second layer having a predetermined doping gradient;
    (b) forming an etch mask on the opposite surface of said third layer;
    (c) applying a first fluid etchant in concert with ultrasonic agitation to regions of said third layer where exposed by said etch mask said first fluid etchant consisting of, by weight, 2 parts KOH to 3 parts $H_2O$ at 60° C. and acting to pre-thin said third layer;
    (d) shining a light through said first layer and into said wafer while said first fluid etchant is applied until said exposed regions become translucent;
    (e) subdividing said wafer into smaller components;
    (f) applying a second fluid etchant in an agitation washtub to said components having exposed regions etched by said first fluid etchant, said second fluid etchant consisting of 1 part HF to 3 parts $HNO_3$ to 10 parts acetic acid in concert with a critical volumetric amount of $H_2O_2$ such that said exposed region of said third layer and a portion of said transition region lying thereunder is etched away, said critical amount of $H_2O_2$ having a critical ratio to said second fluid etchant dependent on the area exposed to said second fluid etchant, said proportion being 2:350 for a ⅛ square inch area and 5:350 for areas up to 3 square inches;
    (g) removing said components when said exposed areas appear flat and reflecting; and
    (h) applying a third fluid etchant to said exposed areas of said components to clean them, said third fluid etchant consisting of, by proportion, 1.0 gram potassium permanganate to 150 ml HF to 150 ml acetic acid.

2. The method of claim 1 wherein said first layer is a sapphire substrate.

3. The method of claim 1 wherein said epitaxial second layer is boron doped to about $5 \times 10^{14}/cm^3$ and has approximately 5 to 15 microns thickness.

4. The method of claim 1 wherein said third layer is a p+ substrate boron doped to about $2 \times 10^{19}/cm^3$ and has approximately 10 to 20 mils thickness.

5. The method of claim 1 wherein said transition region has a boron doping density of about $10^{17}/cm^3$.

* * * * *